United States Patent [19]

Norbeck et al.

[11] Patent Number: 4,965,658
[45] Date of Patent: Oct. 23, 1990

[54] SYSTEM FOR MOUNTING AND COOLING POWER SEMICONDUCTOR DEVICES

[75] Inventors: Dean K. Norbeck, York; Harold R. Schnetzka, II, Spring Grove, both of Pa.

[73] Assignee: York International Corporation, York, Pa.

[21] Appl. No.: 291,780

[22] Filed: Dec. 29, 1988

[51] Int. Cl.[5] .......................................... H01L 23/42
[52] U.S. Cl. ...................................... 357/79; 357/81; 357/82; 361/386; 165/80.2; 165/104.33
[58] Field of Search ............................ 357/79, 82, 81; 361/386; 165/80.2, 104.33; 437/248, 902

[56]  References Cited
U.S. PATENT DOCUMENTS 3,986,201  10/1976  Herold et al. ........................... 357/79
4,672,422   6/1987  Schierz .................................... 357/82

FOREIGN PATENT DOCUMENTS 0055171  5/1979  Japan ..................................... 357/76
0099757  6/1982  Japan ..................................... 357/79
0092348  4/1987  Japan ..................................... 357/82

OTHER PUBLICATIONS

"High Current Power Semiconductor Modules: How to Cool Them" by Longenecker et al., Power Conversion International, May/Jun. 1985.
"Heat Transfer" by J. P. Holman, 4th ed., pp. 97–102.

Data Sheets for Westinghouse, "Open–Brik Modules" TM, dated Mar. 85.
"Collection of Helpful Hints for: Designing, Using, and Cooling Power Semiconductor Assemblies" by Sheppard et al., IEEE/IAS annual conf., Sep. 28–Oct. 3, 1986.

Primary Examiner—Rolf Hille
Assistant Examiner—Minh Loan Tran
Attorney, Agent, or Firm—Finnegan, Henderson, Farabow, Garrett & Dunner

[57] ABSTRACT

Semiconductor apparatus for mounting and cooling disc type semiconductor devices. The apparatus includes two disc type semiconductor devices each having a pole face thereof in contact with a first terminal bar, that bar in turn being in contact, through thermally conductive electrical insulation, with a water-cooled plate. The opposite pole face of each disc device is in electrical and thermal contact with a first surface of a respective metallic block. A second surface of each block, opposing the first face, is in electrical conductive contact with a second terminal bar. A compressive mounting force is applied across the first and second terminal bars to appropriately compress the disc devices. Each metallic block is sized to absorb a substantial portion of the disc device junction heat generated during a transient portion of a duty cycle, such as may correspond to the starting of a motor.

30 Claims, 3 Drawing Sheets

SYSTEM FOR MOUNTING AND COOLING POWER SEMICONDUCTOR DEVICES

The present invention relates in general to the mounting and cooling of power semiconductor devices and, more particularly, to the mounting and cooling of disc type power semiconductor devices used in starting circuits for electrical motors.

BACKGROUND OF THE INVENTION

Power semiconductor devices such as diodes, SCRs and thyristors are typically applied in, although not limited to, rectifier and AC switch circuits to regulate the flow of power from an AC source to an electrical load. Such an electrical load may be, for example, an AC or DC motor for a liquid chiller in an air conditioning system. The semiconductor devices are rated and applied to conduct significant amounts of current and, in the process, generate corresponding significant amounts of heat. The generated heat results in an increase in the junction temperature of the semiconductor device. The devices are normally rated for current carrying capacity as a function of junction cooling capability, with the rated amount of current increasing with increasing cooling capacity. Exceeding the rated current for a particular junction temperature degrades the device and can result in device failure. It is desirable, in order to achieve maximum utilization of power semiconductor devices, to provide device cooling to enable greater amounts of current to be conducted by the device without exceeding the device junction temperature rating.

Power semiconductor devices are manufactured in at least two types according to the manner in which the electrical connections of the device are made accessiable. Those two types are referred to as the stud type and disc type. As explained below, the preferred embodiment of the present invention is directed to the mounting and cooling of disc type semiconductor devices. The principles of the invention, however, may be applicable to stud type devices.

As is well known in the art, such disc type devices consist of the semiconductor device, e.g., diode, transistor or thyristor, positioned within a disc shaped container having opposing metallic pole faces that are spaced from one another by an annular insulating skirt. Upon mounting the disc device for circuit operation, it is necessary to apply a compressive force to the opposing pole faces to bring them into contact with the respective proximate anode or cathode of the semiconductor device contained within the disc shaped container. The disc device mounting configurations known in the art provide some cooling for the device and also provide a mechanism for applying the requisite compressive mounting force to the disc faces.

One mounting configuration known in the art for mounting a disc type device is illustrated in FIG. 1. The mounting configuration includes a double-sided, fin cooled apparatus 100 in which a disc device 102 is compressed between two air-cooled, metallic finned heat sinks 104 and 106. Hardware for clamping the two heat sinks together to achieve the requisite compressive mounting force on disc device 102 is not shown. Hardware for accessing the pole faces of device 102 for electrical connection thereto is also not shown in the figure.

It is also known to mount disc type devices in pairs with the two disc devices mounted in an electrically parallel configuration, the anode and cathode of the respective devices being connected together. Such parallel mounting is provided because of the utility of that arrangement in various circuit configurations. One parallel mounting configuration known in the art is illustrated in FIG. 2. The illustrated disc device mounting and cooling apparatus 200 includes disc type devices 202 and 20 mounted between first and second bus terminal bars 206 and 208. Devices 202 and 204 can thus be mounted between terminal bars 206 and 208 in the electrically parallel configuration described above. Terminal bar 206 is electrically insulated from a water-cooled plate 210 by a sheet of thermally conductive, electrically insulating material 212. Apparatus 200 may alternatively be configured to substitute an air-cooled finned heat sink (not shown in FIG. 2) in place of plate 210. Apparatus 200 further includes a pressure plate 214 for applying pressure to terminal bar 208 via ball bearings 216 and 218 and metallic discs 220 and 222, the combination of bearings and metallic discs serving to evenly distribute the force applied to disc devices 202 and 204. A through bolt 224 is affixed to plate 210, the bolt extending through and being insulated from (by means not shown) terminal bars 206 and 208. Bolt 224 extends through pressure plate 214. By tightening a nut 226, over a washer 228, onto the pressure plate, a suitable compressive force is applied to devices 202 and 204. A sheet of electrically insulating material 230 is provided to electrically isolate discs 220 and 222 and pressure plate 214 from terminal bar 208. The means for cooling each disc device 202,204 is through the pole face thereof in contact with terminal bar 206, the heat being conducted from the terminal bar, through electrically insulating sheet 212, to plate 210. Apparatus generally configured as apparatus 200 is commercially available as open power modules from Powerex, Inc., of Youngwood, Pa. Apparatus 200 only affords cooling of one side of each semiconductor disc device and, therefore, may have a limited current carrying capacity or need to be constructed to have a sufficiently large size to meet a current carrying requirement.

Another known manner of mounting and cooling semiconductor devices is illustrated in FIG. 3. The disc mounting and cooling apparatus 300 includes two semiconductor disc devices 302 and 304 which are each provided with cooling on both of their respective pole faces. Apparatus 300 includes cylindrical metallic masses 306, 308 and 310 between which are interposed the disc devices. The cylindrical masses are in thermal and electrical conductive contact with the disc devices. The disc devices and metallic masses rest in a cylindrical shaped depression of a metallic base 312, a layer of insulating material (not shown) being provided to electrically insulate the devices and masses from the base. Apparatus 300 further includes a water-cooled mounting plate 314, in thermal conductive contact with base 312, for cooling the disc devices. Arrows 316 and 318 are provided to indicate the circulation of cooling water through plate 314. Apparatus 300 also includes a cover 320, partially shown in FIG. 3, which fits over the devices and masses and onto base 312. Since each mass can be at an electrical potential, cover 320 is electrically isolated from them (by means not shown). Further, the cover includes three openings through which pass insulating sleeves 322, 324 and 326, electrical leads corresponding to the disc device pole faces being brought out of device 300 via these sleeves. Apparatus 300 further includes means such as springs mounted at opposing ends within cover 320 to apply a compressive mounting force $F_c$ to the disc devices via the cylindrical masses. The heat generated by each disc device is conducted through each pole face to the proximate cylindrical mass and from the cylindrical mass to the metallic base 312 and the water-cooled plate 314. Apparatus generally configured as illustrated in FIG. 3 is commercially available as closed power modules manufactured by Powerex, Inc.

The inventors of the present invention have found that none of the above mounting systems have provided optimum results, when power semiconductor devices are applied in power supply circuits for large motors. By means of example only, a plurality of semiconductor devices are used in starting circuits for motors in substantial air conditioning and heat pump systems. The motors typically have horsepower ratings within the range of 100 to 1000 hp, and during start up and operation the semiconductor devices generate significant amounts of heat.

The typical duty cycle to which the semiconductor devices are subjected in such circuits is illustrated in FIG. 4 which shows a plot 400 of semiconductor device power dissipation $P_D$ as a function of time. The duty cycle is characterized by an initial transient period of operation 402 during motor starting, followed by a steady-state period of operation 404 during motor running. As an example, a starting current $I_{start}$ of the motor may have a magnitude that is approximately 3 times a motor running current $I_{run}$, i.e., $I_{start} \approx 3 \times I_{run}$, and the transient period may last in excess of 30 seconds. In such a case, the semiconductor device power dissipation during starting, $P_{start}$, will be approximately four times the device power dissipation during running, i.e., $P_{run}$. The mounting and cooling configuration selected for the semiconductor devices applied in the motor power supply circuit must be capable of carrying the starting current for the duration of the transient starting period and the running current on a continuous basis without exceeding a maximum allowable junction temperature of the semiconductor devices.

In order to carry significant levels of starting current, e.g., in excess of 3000 amps, disc device mounting and cooling apparatus of the type illustrated in FIG. 1 must be physically quite large so that substantial physical space must be allocated therefor. This size limitation has not been acceptable in commercial applications.

The mounting system illustrated in FIG. 2 also has significant limits. By means of example, FIG. 5 illustrates a plot 500 of semiconductor device junction temperature $T_j$ as a function of time, with the motor starting and running period being delineated in the figure. A maximum junction temperature of 125° C. is assumed, although semiconductor devices with other maximum junction temperatures are available. The junction temperature characteristic curves shown in FIG. 5 all correspond to the same exemplary duty cycle. That duty cycle consists of a motor starting current of 1400 amps for 40 seconds and a steady state running current of 510 amps. Curve 502 (solid line) corresponds to the junction temperature of semiconductor devices mounted as illustrated in FIG. 2 with respect to apparatus 200. As can be seen, the cooling of only one side of each semiconductor device in apparatus 200 results in an unacceptable cooling capability during motor starting as compared to the motor running period. The user is, therefore, left with the alternatives of either derating the starting capability or using a mounting system 200 with semiconductor devices having a larger rating so that the maximum junction temperature is not exceeded. Choosing the former alternative results in limited starting capabilities. The latter alternative leads to greater expense and physical size of the apparatus. Further, with respect to the latter alternative, while the maximum junction temperature will not be exceeded, the junction temperature during the steady state operation period will be substantially below the maximum junction temperature, e.g., by 50% Such a substantial temperature margin during steady-state operation represents an inefficient use of the semiconductor devices, at least from the view of costs.

The mounting system shown in FIG. 3 also has been less than fully acceptable. Curve 504 (alternating long and short dashes) corresponds to the junction temperature of semiconductor devices mounted such as in apparatus 300 (FIG. 3) and applied to the motor power supply circuit. As can be seen, that apparatus is capable of providing adequate device cooling during the transient operation period such that the maximum junction temperature is not exceeded. However, the junction temperature experienced during the steady-state operation period, e.g., 60° C., is substantially below the maximum junction temperature, i.e., by more than 50%. As indicated above, such a substantial temperature margin during steady-state operation represents an inefficient use of the semiconductor devices. Further, the user bears the cost of obtaining the cooling capacity required to accommodate the transient operation, while such cooling capacity is greatly underutilized during the steady-state operation period.

SUMMARY OF THE INVENTION

It is an object of the present invention to provide a system for mounting and cooling disc type semiconductor devices that provides efficient use of the semiconductor devices without exceeding its maximum junction temperature.

Another object is to provide a system which economically keeps the temperature of the semiconductor devices below its maximum junction temperature during start-up and yet does not overcool the semiconductor devices during steady-state operation.

Yet another object is to provide a compact and efficient mounting and cooling system for semiconductor devices used for controlling transient loads such as large motors.

Additional objects and advantages of the invention will be set forth in part in the description which follows, and in part will be obvious from the description, or may be learned by practice of the invention. The objects and advantages of the invention may be realized and attained by means of the elements and combinations particularly pointed out in the appended claims.

To achieve the objects and in accordance with the purpose of the invention, as embodied and described herein, there is provided a system for mounting and cooling one or more semiconductor devices which are subject to a duty cycle including an initial transient period during which the semiconductor device or devices generate heat at a greater rate than they do during steady-state operation, the system comprising: conducting terminal means, in thermal and electrical conductive contact with at least a first pole of a semiconductor device; first thermal heat sink means, in thermal conductive contact with the terminal means, for receiving heat generated within the semiconductor device during device operation; second thermal heat sink means, in thermal conductive contact with the semiconductor device, for receiving heat generated within the semiconductor device during device operation; and the first and second heat sink means having respective first and second predetermined heat capacities to maintain the semiconductor device or devices at or below a predetermined maximum junction temperature during predetermined transient and steady-state periods of device operation.

The accompanying drawings which are incorporated in and constitute a part of this specification, illustrate embodiments of the invention and, together with the description, serve to explain the principles of the invention.

DESCRIPTION OF THE PREFERRED EMBODIMENT

Figure 6:
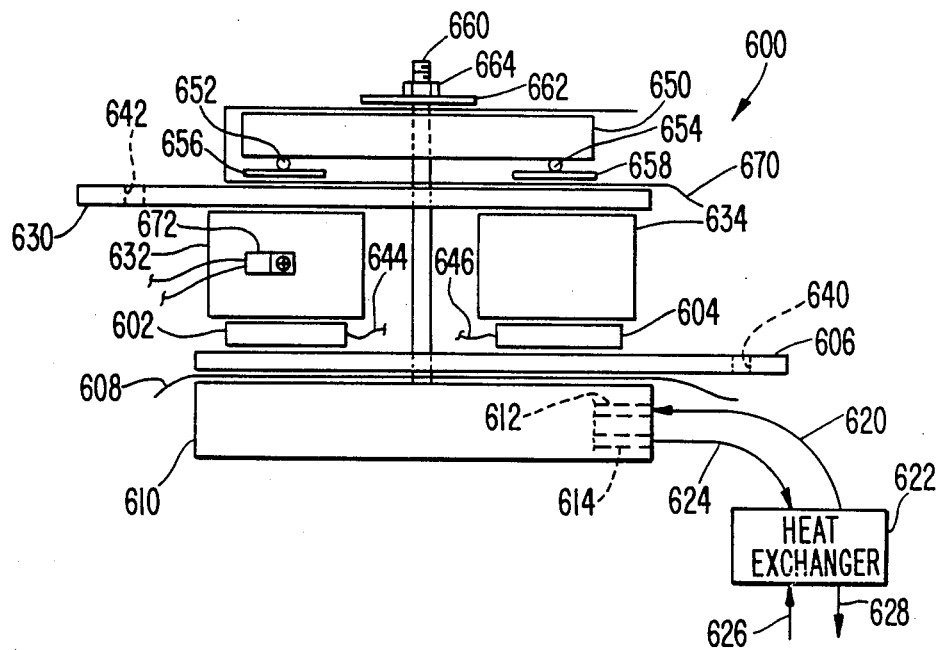
FIG. 6 illustrates semiconductor apparatus constructed in accordance with an embodiment of the invention.

FIG. 6 illustrates semiconductor apparatus 600 constructed in accordance with the present invention. Apparatus 600 comprises semiconductor disc type devices 602 and 604 that are in conductive contact with a bus type terminal bar 606, that bar preferably being fabricated of copper. Apparatus 600 includes first thermal heat sink means for receiving heat generated by the semiconductor devices during operation. As embodied herein, the first heat sink means is provided as a water-cooled plate 610. A sheet of insulating material 608, such as Cho-therm 1671 (manufactured by Chomerics, Inc., of Hudson, N.H.) having a nominal thickness of 0.015 inches, electrically insulates terminal bar 606 from water-cooled plate 610. Plate 610 is preferably fabricated from copper and has liquid coolant flow passages therein, diagramatically shown as passages 612 and 614 in FIG. 6, for the circulation of a coolant such as water through the plate. The openings for connecting to the passages, while diagrammatically indicated in FIG. 6 at one end of the plate, can be provided anywhere on the plate that facilitates mounting and operation of apparatus 600, e.g., on a bottom face of the plate. The liquid coolant circulated through plate 610 is illustrated as being received (arrow 620) from a heat exchanger 622, the coolant discharged from the plate being returned (arrow 624) to the heat exchanger. The heat exchanger is further diagramatically illustrated, by return and discharge arrows 626 and 628, as being coupled to an external cooling loop. The provision of heat exchanger 622 represents a preferred scheme for providing cooling facilities proximate device 600. Alternatively, plate 610 can be coupled to an open cooling loop, i.e., one in which the liquid coolant discharged from the plate is not returned thereto.

Apparatus 600 also includes a bus type terminal bar 630 that is preferably fabricated of copper. Apparatus 600 further includes second thermal heat sink means for receiving heat generated by the semiconductor devices. As embodied herein, the second heat sink means is provided as two thermal heat sink masses in the form of metallic blocks 632 and 634 that are respectively interposed between devices 602 and 604 and terminal bar 630. Blocks 632 and 634 are preferably cubical in shape and composed of copper. Blocks 632 and 634 are in electrical conductive contact with terminal bar 630 and, respectively, devices 602 and 604. Further, the blocks are also in thermal conductive contact with the respective devices 602 and 604 and with terminal bar 630. Each block 632,634 provides an electrical conductive path between terminal bar 630 and the semiconductor device in contact therewith.

With devices 602 and 604 arranged such that the cathode pole face of one and the anode pole face of the other each abut the same terminal bar, the above-described parallel electrical configuration of the devices is achieved. Obviously, the construction of apparatus 600 is not limited to this orientation of the device pole faces. Holes 640 and 642 are respectively provided in terminal bars 606 and 630 to enable electrical connection to the devices. In the case where the semiconductor devices are of the three-terminal type, e.g., SCRs, gate leads 644 and 646 are shown emanating from devices 602 and 604, respectively.

The inventive apparatus further includes means for applying a compressive mounting force to each semiconductor device. As embodied herein, the force application means comprises a pressure plate 650, e.g., preferably fabricated from stainless steel, for applying pressure to terminal bar 630 via ball bearings 652 and 654 and metallic discs 656 and 658. Each bearing and metallic disc are positioned in vertical alignment with the center of one of the semiconductor devices. A through bolt 660 passes through pressure plate 650, terminal bars 606 and 630 and insulating material 608 and is anchored, by means not shown, in cooling plate 610. The end of bolt 660 projecting through pressure plate 650 is threaded to receive a spring washer 662 and nut 664. Nut 664 is tightened to exert a compressive mounting force across terminal bars 606 and 630 to compress the two metallic blocks and semiconductor devices. The arrangement of the pressure plate, bearings and metallic discs serve to evenly apportion the compressive force between the two devices. Through bolt 660 is insulated from terminal bars 606 and 630 preferably by insulating sleeving. A sheet of electrical insulating material 670, such as Aramid insulating paper (manufactured as Nomex TM insulating material by E.I. DuPont de Nemours Co., Inc., of Wilmington, Del.) having a nominal thickness of 0.030 inches, is provided to electrically insulate the terminal bar from pressure plate 650, ball bearings 652,654 and metallic discs 656,658. Although not required, block 632 is preferably provided with a thermistor 672 or similar temperature sensing device, respectively connected to monitor block temperature during operation of the semiconductor devices.

Figure 4:
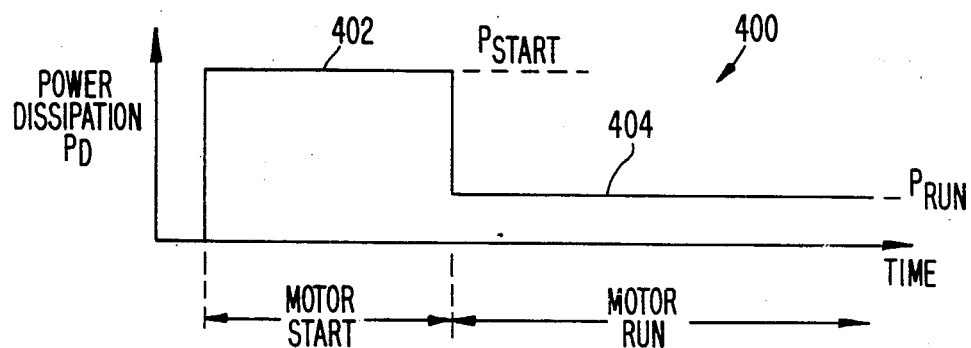
FIG. 4 illustrates an exemplary duty cycle to which a semiconductor device may be subjected.
Figure 5:
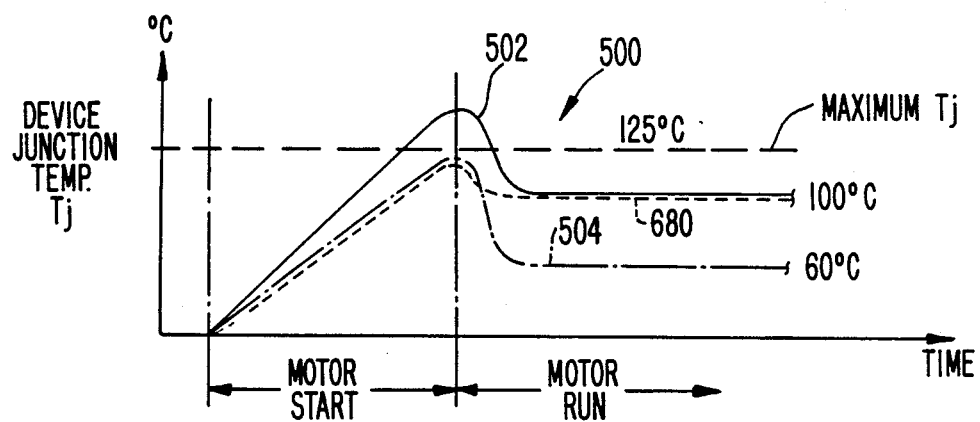
FIG. 5 illustrates a set of junction temperature characteristics of semiconductor devices in different environments.

In operation, apparatus 600 including metallic blocks 632 and 634 provides more efficient cooling of devices 602 and 604 in the case where those devices are subjected to a duty cycle consisting of a transient operation period in which the devices conduct a first electrical current, followed by a steady-state operation period in which the devices conduct a second electrical current of lower magnitude than the first electrical current Apparatus 600 is especially efficacious in operation when applied in the power supply circuit of a motor. FIG. 5 illustrates as curve 680 (dashed line), the junction temperature characteristic duty cycle such as illustrated in FIG. 4 and the same duty cycle corresponding to the thermal characteristics 502 and 504 of devices 200 and 300, respectively. As can be seen, apparatus 600 not only maintains the device junction temperature at or below the maximum junction temperature but also provides a steady-state junction temperature value, i.e., 100° C., that is not substantially below the maximum junction temperature. For example, the steady-state junction temperature may be maintained within 80% of the maximum junction temperature.

Figure 1:
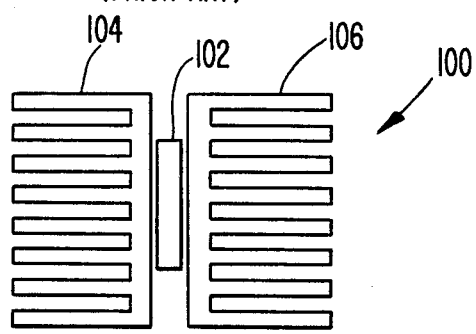
FIG. 1 illustrates a configuration known in the art for mounting disc type semiconductor devices.
Figure 2:
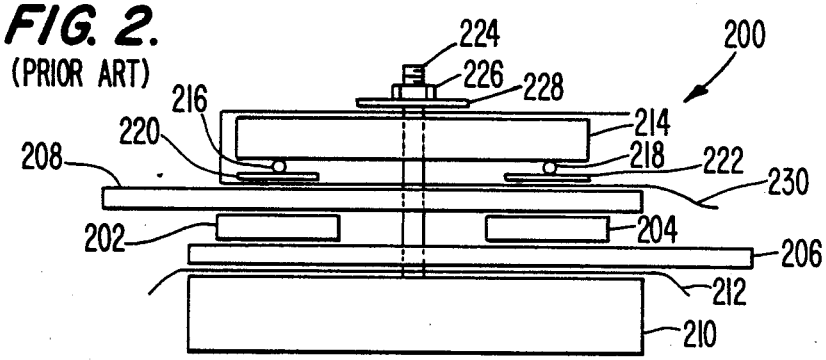
FIG. 2 illustrates a configuration known in the art for mounting two disc type semiconductor devices.
Figure 3:
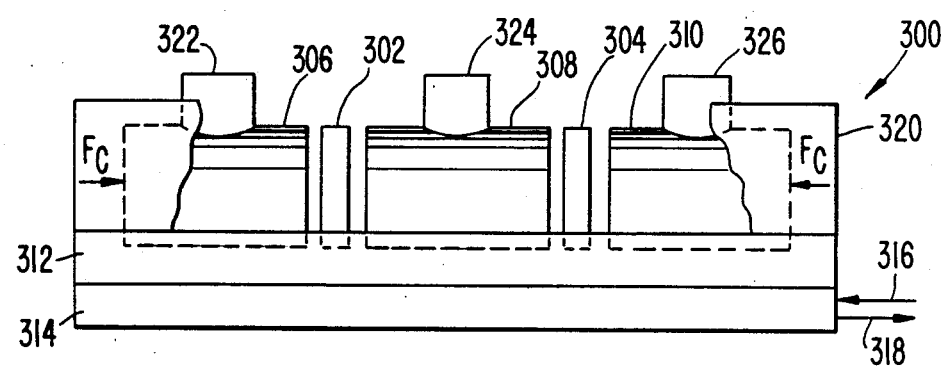
FIG. 3 illustrates another configuration known in the art for mounting two disc type semiconductor devices.

The temperature characteristic 680 illustrated in FIG. 5 is based on use of semiconductor devices such as manufactured by Powerex, Inc., as SCR model no. T8201290, each terminal bar being one-quarter inch thick and approximately 8½ inches in length, each copper thermal heat sink block being rectangular with approximate dimensions of 2⅛" wide, 2⅞" deep, 1¼" high, and a minimum water flow rate of 1.5 gpm through plate 610 with a maximum water inlet temperature of 43° C. during the motor steady state operating period and 46° C. during the transient period. Apparatus 600 to which characteristic 680 corresponds has, with the exception of metallic blocks 632 and 634, the same overall dimensions and parameters as device 200 (FIG. 2) to which junction temperature characteristic 502 corresponds. Junction temperature characteristics 502 and 680 thus illustrate the effect of metallic blocks 632 and 634 on semiconductor device performance.

To achieve the superior performance evidenced by characteristic 680, apparatus 600 is designed so that metallic blocks 632,634 absorb a significant portion of the heat generated by the semiconductor device during the transient start-up operation period. In comparison, a lesser portion of the heat generated during the start-up period is transferred through plate 610. Thus, during the 40 second period during which the semiconductor devices are subjected to high current loads for start-up, a significant portion of the generated heat is transferred to blocks 632 and 634 which gradually rise in temperature. When the start-up operation is concluded, the entire system returns to a steady-state operation in which each block absorbs a negligible amount of the heat generated by each device during the steady-state operation period, plate 610 receiving the majority of this heat. As a result blocks 632 and 634 and the semiconductor devices reach the lower, preferred operating temperature.

Thermistor 672 enables determination of block temperature so that, should it be desired to restart a motor that was previously running, the restart can be prevented until the blocks cool to a sufficiently low temperature. That is, upon restart, each block should preferably be at an initial temperature that will enable it to absorb the heat generated by its associated semiconductor device during starting so that the maximum junction temperature of the device is not exceeded. Similarly, if a motor for some reason does not start within the start-up period for which a system is designed, the thermistor would in effect inform the user (or the control for the motor) that another start-up should not be tried until the semiconductor devices and mounting system are allowed to cool. Further, the thermistor affords a convenient means for monitoring device junction temperature during steady-state operation.

Figure 7:
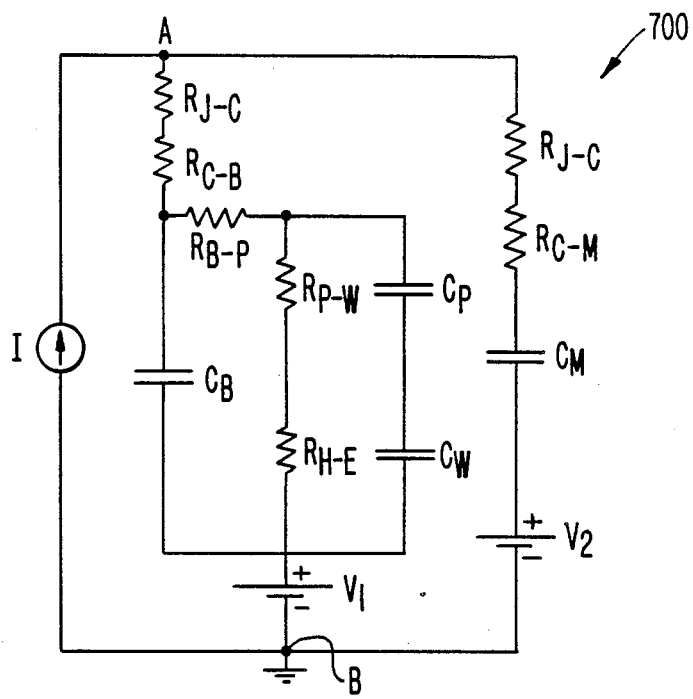
FIG. 7 illustrates an electrical circuit analog for modeling the heat transfer that occurs in the semiconductor apparatus illustrated in FIG. 6.

FIG. 7 illustrates an electric circuit analog 700 that models with electrical components the heat transfer that occurs in apparatus 600. As is known in the art, such a circuit analog can be evaluated using thermal parameters for the various circuit components to yield temperature values at different positions of the circuit analog. Thus, electrical resistors correspond to thermal resistance, capacitors correspond to heat capacity, voltages and voltage supplies correspond to temperatures and reference temperatures, and currents and current sources correspond to heat flow and sources of heat flow. For specified conditions, circuit analog 700 can be used to compute the appropriate size or blocks 632 and 634 for a particular application. Due to the symmetry of apparatus 600, circuit analog 700 is configured to represent a single semiconductor device and thermal heat sink block.

Referring to FIG. 7, node A corresponds to the junction temperature of the semiconductor device. Thus, the voltage computed for node A will correspond to the junction temperature. $R_{J-C}$ represents the thermal resistance between the semiconductor device contained within the disc and the inside of the disc pole face. $R_{C-M}$ represents the thermal resistance between the device pole face and the thermal mass (i.e metallic block) and $C_M$ represents the heat capacity of the thermal mass. Voltage supply $V_2$ represents an assumed initial temperature of the thermal mass, relative to a 0° reference at node B, at the beginning of the duty cycle. $R_{C-B}$ represents the thermal resistance between the disc device and terminal bar 606. $R_{B-P}$ represents the thermal resistance between terminal bar 606 and plate 610 including insulating material 608 interposed therebetween. $C_B$, $C_P$ and $C_W$ respectively represent the heat capacities of terminal bar 606, plate 610 and the water contained in the cooling loop formed between the plate and heat exchanger. $R_{P-W}$ represents the thermal resistance between plate 610 and the water flowing therein. $R_{H-E}$ represents the thermal resistance across heat exchanger 622, i.e., between the cooling loop connected to plate 610 and the external cooling loop represented by arrows 626 and 628. Voltage supply $V_1$ represents an assumed temperature of the water in the external loop as it enters heat exchanger 622. Current source I represents the heat generated in the semiconductor junction. Thus, by employing temperatures (° C.), heat capacities (joules/° C.) and thermal resistances (° C./watts), circuit analog 700 can be solved to determine a suitable value for $C_M$ that, for a prescribed duty cycle, limits the temperature at node A to less than or equal to the maximum junction temperature. Upon determining the value of $C_M$, the physical size of the block can be determined. Computer programs are available for performing the requisite circuit analysis, an exemplary program being the "Analog Work Bench" program sold by Analog Design Tools, Inc., of Sunnyvale, Calif.

A set of exemplary values for the circuit elements described above is listed below in Table I. The values are based on the semiconductor device being an SCR such as manufactured by Powerex, as model T720-45.

TABLE I

| | | |
|---|---|---|
| $R_{J-C}$ | = | 0.120° C./watt |
| $R_{C-M}$ | = | 0.040° C./watt |
| $R_{C-B}$ | = | 0.040° C./watt |
| $R_{B-P}$ | = | 0.074° C./watt |
| $R_{P-W}$ | = | 0.0483° C./watt |
| $R_{HE}$ | = | 0.0136° C./watt |
| $C_P$ | = | 462.6 joules/°C. |
| $C_M$ | = | 432.4 joules/°C. |
| $C_B$ | = | 68.12 joules/°C. |
| $C_W$ | = | 1313 joules/°C. |
| $V_1$ | = | 37.7° C. |
| $V_2$ | = | 43.3° C. |
| I (transient operation) | = | 540 amps |
| I (steady-state operation) | = | 150 amps |

It is noted that in the case where heat exchanger 622 is not used and plate 610 is coupled to an open cooling loop, $C_W$ will become very large and $R_{H-E}$ will become a short circuit. It is also noted that the heat capacity $C_M$ indicated in Table I for the metallic block corresponds to a rectangular copper block with dimensions 2⅛" wide, 2⅞" deep and 1¼" high.

Figure 8:
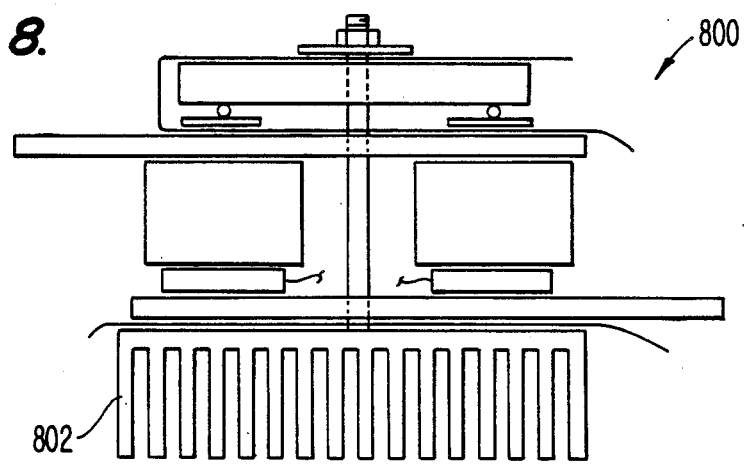
FIG. 8 illustrates semiconductor apparatus constructed in accordance with another embodiment of the invention.

While semiconductor apparatus 600 illustrated in FIG. 6 comprises plate 610 through which a liquid coolant is circulated, the invention is not so limited. FIG. 8 illustrates semiconductor apparatus 800 that is identical to apparatus 600 except that plate 610 is replaced with air-cooled metallic fins 802. It is noted that since the metallic blocks absorb a significant portion of heat generated by the semiconductor junction during the transient operation period, the fins need only be sized to meet the cooling requirements corresponding to the steady-state operation period. It is noted that the fins need not be metallic and could be constructed of a suitable nonmetallic, thermally conductive material.

Figure 9:
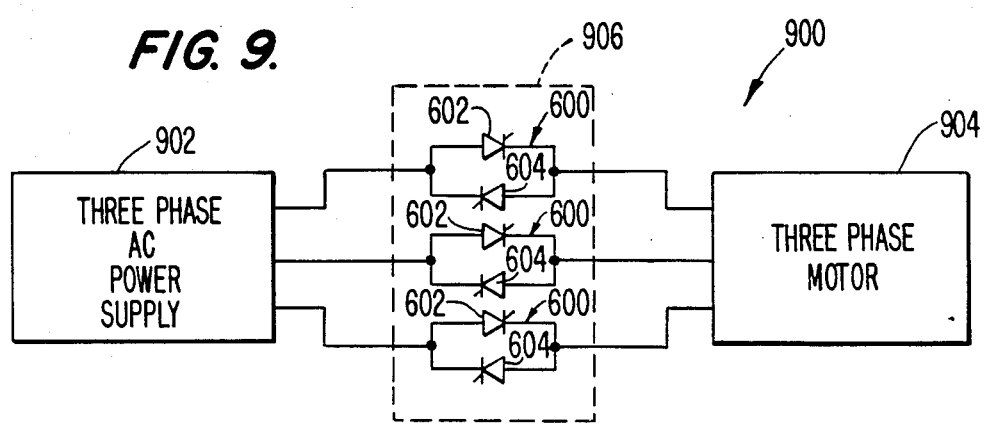
FIG. 9 illustrates a power supply system comprising the semiconductor apparatus of the invention.

FIG. 9 illustrates a power supply system 900 comprising an AC power supply in the form of a three phase power supply 902, an AC load in the form of a three phase motor 904 and a configuration of semiconductor elements, in the form of an AC switch 906, for regulating the flow of power from power supply 902 to motor 904. AC switch 906 consists of three pairs of SCRs, each pair being connected in parallel with the anode of one SCR connected to the cathode of the other SCR. Each pair of SCRs can thus be provided in the form of apparatus 600 with semiconductor devices 602 and 604 provided as SCRs. To this end, the two SCRs in each pair of SCRs of AC switch 906 are labelled 602 and 604 and each parallel connected pair of SCRs is labelled 600. System 900 also includes means, not shown, for generating and applying appropriate gating signals to the respective SCRs to regulate the power flow to motor 904.

In the operation of system 900, AC power supply 902 is energized and gating signals are applied to the SCRs of switch 906 to cause current flow to motor 904. That current flow commences with a transient operation period that has a duration corresponding to the time required for the motor to reach its rated operating speed, the motor starting current $I_{start}$ being greater than the motor running current $I_{run}$, e.g., $I_{start} \approx 3 \times I_{run}$. The transient operation period is followed by the steady-state period of motor operation during which the current $I_{run}$ flows. During the starting and running of motor 904, the respective SCRs of switch 906 experience a junction temperature characteristic analogous to characteristic 680 illustrated in FIG. 5 such that the maximum junction temperature is not exceeded during starting and efficient use of the SCRs is made.

As an example only, a semiconductor starter apparatus used for a 201 horsepower, three phase AC motor, that operates a liquid chiller, would include six SCRs mounted in three separate mounting and cooling systems. In the exemplary system, the motor is rated 460 volts and is controlled by the starter apparatus to draw approximately 700 amperes during starting for a period of approximately 40 seconds and draw a steady-state operating current of approximately 260 amperes. The three SCR mounting and cooling systems are each configured as the above described and illustrated semi apparatus 600. Each SCR is provided as a model T7201245 SCR manufactured by Powerex, Inc., and has a maximum junction temperature rating of 125° C. Each metallic block is composed of copper, is rectangular with dimensions 2⅛" wide, 2⅞" deep and 1¼" high. During operation, cooling water of a maximum temperature of 43° C. is circulated through the water-cooled plate of apparatus 600 at a rate of approximately 1.5 gallons per minute. Bus bars 606 and 630 are composed of copper and each are 1¾ inches wide, 8½ inches long and ¼ inch thick. Under these exemplary conditions and based on the average power dissipated by one semiconductor device over the 40 second starting period the metallic block is computed to absorb the thermal equivalent of 280 watts of dissipated power, while the water-cooled plate absorbs the thermal equivalent of 260 watts. During steady state operation, the water-cooled plate is computed to absorb substantially all power dissipated by the semiconductor device.

While the metallic blocks of the semiconductor apparatus of the present invention are fabricated of copper, the invention is not so limited. The invention can be successfully practiced with the blocks fabricated of other materials, compounds or alloys. In such cases, the respective sizes of the blocks would require adjustment in accordance with the heat capacity of the block material used. Further, while the terminal bars are preferably provided as copper, another conductive material such as aluminum may be substituted therefor. Additionally, while water-cooled plate 610 is preferably fabricated of copper, the plate could instead by constructed of a different thermally conductive metallic or nonmetallic material.

While the semiconductor apparatus of the present invention is illustrated and described as comprising two disc type semiconductor devices and corresponding metallic blocks the invention is not so limited. The invention can as readily be embodied in semiconductor apparatus comprising a single disc type device. In such a case, only a single metallic block would be provided and mounted in thermal and electrical contact with one pole face of the single device. Alternatively, semiconductor apparatus can be constructed in accordance with the invention to comprise more than two disc type semiconductor devices. While in such apparatus a different metallic block would preferably be provided for each semiconductor device, the specific configuration of devices would have to be arranged in accordance with the required electrical connection between the devices. In any event, each device would have one pole face thereof in indirect contact with water- or air-cooled means and the other pole face in contact with a metallic block serving as a thermal heat sink mass.

While semiconductor apparatus 600 and 800 are illustrated as comprising two metallic blocks in contact with the respective semiconductor devices therein, the invention is not so limited. A single metallic block contacting both semiconductor devices can be substituted for the two blocks. In such a case, the single block would be fabricated to ensure good electrical and thermal conductive contact with both devices. Further, the block would include an opening to enable passage therethrough of the through bolt. It is further noted that while apparatus 600 and 800 are preferably constructed with each metallic block interposed between a semiconductor device and terminal bar 630, the apparatus could instead by constructed with the terminal bar interposed between the metallic blocks and semiconductor devices.

The present invention is not limited to an apparatus which utilizes water as a liquid coolant. The invention as embodied in apparatus 600 may be practiced with equal effectiveness while using other liquid coolants.

While apparatus 600 and 800 are illustrated and described as including a specific arrangement of elements for applying the compressive mounting force to the disc type semiconductor devices, other arrangements are known in the art for applying the force. The invention can be practiced with equal effectiveness using such other arrangements.

While the apparatus illustrated in FIGS. 1-3, 6 and 8 are described herein as including thermal and conductive contact between various components thereof, the apparatus is illustrated to show spacing between the components. Such spacing is included only to provide greater clarity in illustrating each apparatus, it being understood that upon applying the appropriate compressive mounting force to each apparatus, no such spacing would be present.

Thus, it is intended that the present invention cover the modifications and variations of this invention provided they come within the scope of the appended claims and their equivalents.

What is claimed is:

1. A system for mounting and cooling one or more semiconductor devices which are subject to a duty cycle including an initial transient period during which the semiconductor device or devices generated heat at a greater rate than during steady-state operation, the system comprising:
   conducting terminal means in thermal and electrical conductive contact with at least a first pole of a semiconductor device;
   first thermal heat sink means, in thermal conductive contact with said terminal means, for receiving heat generated within the semiconductor device during device operation;
   second thermal heat sink means, in thermal conductive contact with said semiconductor device, for receiving heat generated within the semiconductor device during device operation; and
   said first and second heat sink means having respective first and second predetermined heat capacities to maintain the semiconductor device or devices at or below a predetermined maximum junction temperature during predetermined transient and steady-state periods of device operation, said first and second predetermined heat capacities being selected such that of the heat generated within the semiconductor device a percentage of heat received by said second thermal heat sink means is greater during the predetermined transient period than during the predetermined steady-state period.

2. The system of claim 1 wherein said second thermal heat sink means is a solid block designed to increase in temperature during the transient period and reach a temperature which is proximate to but does not exceed said maximum junction temperature.

3. The system of claim 2 wherein said second thermal heat sink means includes a separate block for each semiconductor device.

4. The system of claim 3 wherein said first heat sink means comprises air-cooled fins.

5. The system of claim 3 wherein said first heat sink means comprises liquid cooling means.

6. Semiconductor apparatus, comprising:
   a disc type semiconductor device having opposing first and second pole faces;
   first conducting terminal means in thermal and electrical conductive contact with the first pole face of said device;
   first thermal heat sink means, in thermal conductive contact with said first terminal means, for receiving heat generated within said semiconductor device during device operation;
   second thermal heat sink means, in thermal conductive contact with said semiconductor device, for receiving heat generated within said semiconductor device during device operation;
   means for applying a compressive mounting force to compress said second heat sink means and said semiconductor device therebetween; and
   said first and second heat sink means having respective first and second predetermined heat capacities to maintain a semiconductor device junction temperature at or below a predetermined maximum junction temperature during predetermined transient and steady-state periods of device operation, said semiconductor device generating heat at a greater rate during said transient operation period than during said steady-state operation period, said first and second predetermined heat capacities being selected such that of the heat generated within the semiconductor device a percentage of heat received by said second thermal heat sink means is greater during the predetermined transient period than during the predetermined steady-state period.

7. The semiconductor apparatus of claim 6 further comprising a second conducting terminal means and wherein said second thermal heat sink means is in thermal and electrical conductive contact with said semiconductor device and said second terminal means.

8. The semiconductor apparatus of claim 6 wherein said first heat sink means comprises air-cooled fins.

9. The semiconductor apparatus of claim 6 wherein said first heat sink means comprises liquid cooling means.

10. The semiconductor apparatus of claim 9 wherein said liquid cooling means comprises a plate having liquid coolant flow passages therein to receive a liquid coolant.

11. The semiconductor apparatus of claim 10 wherein said plate is composed of copper and said liquid coolant is water.

12. The semiconductor apparatus of claim 6 wherein said second heat sink means comprises a block having a predetermined mass.

13. The semiconductor apparatus of claim 12 wherein said block has a sufficient heat capacity to accept a significant portion of the heat generated by said semiconductor device during the transient operation period and still prevent the temperature of said semiconductor device from exceeding the predetermined maximum junction temperature.

14. The semiconductor apparatus of claim 13 wherein said first heat sink means comprises air-cooled fins.

15. The semiconductor apparatus of claim 13 wherein said first heat sink means comprises liquid cooling means.

16. The semiconductor apparatus of claim 15 wherein said liquid cooling means comprises a plate having liquid coolant flow passages therein.

17. The semiconductor apparatus of claim 16 wherein said plate is composed of copper and said liquid coolant is water.

18. The semiconductor apparatus of claim 12 wherein said first heat sink means comprises air-cooled fins.

19. The semiconductor apparatus of claim 12 wherein said first heat sink means comprises liquid cooling means.

20. The semiconductor apparatus of claim 19 wherein said liquid cooling means comprises a plate having liquid coolant flow passages therein.

21. The semiconductor apparatus of claim 20 wherein said plate is composed of copper and said liquid coolant is water.

22. The semiconductor apparatus of claim 6 wherein said semiconductor device is an SCR.

23. The semiconductor apparatus of claim 6 further comprising means for measuring a temperature of said second heat sink means.

24. The semiconductor apparatus of claim 6 further including electrical insulating means interposed between said first terminal means and said first heat sink means to electrically isolate said first heat sink means from said first terminal means.

25. Semiconductor apparatus, comprising:
a first disc type semiconductor device;
a second disc type semiconductor device, said first and second semiconductor devices each having opposing pole faces;
first conducting terminal means in thermal and electrical contact with one pole face of each said semiconductor device;
second conducting terminal means;
first thermal heat sink means, in thermal conductive contact with said first terminal means, for receiving heat generated within said first and second semiconductor devices during device operation;
second thermal heat sink means, interposed between the other pole face of each said first and second semiconductor device and said second terminal means, for receiving heat generated within each said first and second semiconductor device during device operation, said second heat sink means being in electrical conductive contact with said second terminal means and in thermal and electrical conductive contact with the respective other pole faces of said first and second semiconductor devices, said second heat sink means providing an electrical conductive path from each said other pole face of said first and second semiconductor devices to said second terminal means;
means for applying a compressive mounting force across said first and second terminal means to compress said second heat sink means and said first and second semiconductor devices therebetween; and
said first and second heat sink means having respective first and second predetermined heat capacities to maintain a junction temperature in each said first and second semiconductor device at or below a predetermined maximum junction temperature during predetermined transient and steady-state periods of device operation, said first and second semiconductor devices generating heat at a greater rate during said transient operation period than during said steady-state operation period, said first and second predetermined heat capacities being selected such that of the heat generated within said first and second semiconductor devices a percentage of heat received by said second thermal heat sink means is greater during the predetermined transient period than during the predetermined steady-state period.

26. The semiconductor apparatus of claim 25 wherein each said first and second semiconductor device has a positive and a negative pole face and said first terminal means is in contact with the positive pole face of one semiconductor device and the negative pole face of the other semiconductor device.

27. The semiconductor apparatus of claim 25 wherein said second heat sink means comprises a first and a separate second block in both thermal and electrical conductive contact with said first and second semiconductor devices, respectively.

28. The semiconductor apparatus of claim 27 wherein said first heat sink means comprises a plate having liquid coolant flow passages therein to receive a liquid coolant.

29. The semiconductor apparatus of claim 28 wherein said plate is composed of copper and said liquid coolant is water.

30. Semiconductor apparatus, comprising:
a first disc type semiconductor device;
a second disc type semiconductor device, said first and second semiconductor devices each having a positive and a negative pole face;
a first conducting terminal bar having opposing first and second faces, said first face being in thermal and electrical conductive contact with the positive pole face of one semiconductor device and the negative pole face of the other semiconductor device;
a second conducting terminal bar;
first thermal heat sink means, in thermal conductive contact with the second face of said first terminal bar, for receiving heat generated within said first and second semiconductor devices during device operation;
a layer of insulating material interposed between said first head sink means and said first terminal bar to electrically isolate said first heat sink means for said first terminal bar;
second thermal heat sink means, interposed between said first semiconductor device and said second terminal bar, for receiving heat generated within said first semiconductor device during device operation, said second heat sink means being in electrical conductive contact with said second terminal bar and in thermal and electrical conductive contact with said first semiconductor device, said second heat sink means providing an electrical conductive path from said first semiconductor device to said second terminal bar;

third thermal heat sink means, interposed between said second semiconductor device and said second terminal bar, for receiving heat generated within said second semiconductor device during device operation, said third heat sink means being in electrical conductive contact with said second terminal bar and in thermal and electrical conductive contact with said second semiconductor device, said third heat sink means providing an electrical conductive path from said semiconductor device first pole face to said second terminal bar;

means for applying a compressive mounting force across said first and second terminal bars to compress said second and third heat sink means and said first and second semiconductor devices therebetween; and said first, second and third heat sink means having respective first, second and third predetermined heat capacities to maintain a junction temperature of each said first and second semiconductor device at or below a predetermined maximum junction temperature during predetermined transient and steady-state periods of device operation, said first and second semiconductor devices generating heat at a greater rate during said transient operation period than during said steady-state operation period, said first, second and third predetermined heat capacities being selected such that of the heat generated within said first and second semiconductor devices a percentage of heat received by each said second and third heat sink means is greater during the predetermined transient period than during the predetermined steady-state period.

* * * * *

UNITED STATES PATENT AND TRADEMARK OFFICE
CERTIFICATE OF CORRECTION

PATENT NO. : 4,965,658

DATED : October 23, 1990

INVENTOR(S) : Dean K. Norbeck and Harold R. Schnetzka, II

It is certified that error appears in the above-identified patent and that said Letters Patent is hereby corrected as shown below:

Claim 1, col. 11, line 42, change "one or more" to --at least one disc type--;
      line 43, change "devices" to --device--; and "are" to --is--;
      line 45, change "or devices generated" to --generates--;
      line 50, before "semiconductor" insert --disc type--;
      line 60, delete "predetermined";
      line 61, after "maintain" insert --a junction temperature of--;
      line 62, delete "predetermined";
      line 66, after "that" insert --said second thermal heat sink means receives a greater percentage--;
      line 67, delete "a percentage of heat re-";
      line 68, delete "ceived by said second thermal heat sink means is"; and
      column 12, line 1, delete "greater".

Claim 6, col. 12, line 34, delete "predetermined";
      line 43, after "that" insert --said second thermal heat sink means receives a greater percentage--;
      line 44, delete "a percentage of";
      line 45, delete "heat received by said second thermal heat sink"; and
      line 46, delete "means is greater".

Column 16, line 1, after "third" delete "heat".
      line 2, after "first," insert "and".

UNITED STATES PATENT AND TRADEMARK OFFICE
CERTIFICATE OF CORRECTION

PATENT NO. : 4,965,658

DATED : October 23, 1990

INVENTOR(S) : Dean K. Norbeck and Harold R. Schnetzka, II

It is certified that error appears in the above-identified patent and that said Letters Patent is hereby corrected as shown below:

Claim 25, col. 14, line 4, delete "predetermined";
    line 14, after "that" insert --said second thermal heat sink means receives a greater percentage--;
    line 15, delete "a percent-";
    line 16, delete "age of heat received by said second thermal heat"; and
    line 17, delete "sink means is greater".

Claim 30, col. 14, line 58, change "for" to --from--.
    column 16, line 2, delete "predetermined";
    line 12, after "that" insert --said second and third thermal heat sink means each receive a greater percentage--;
    line 14, delete "a percentage of heat received by each said"; and
    line 15, delete "second and third heat sink means is greater".

Signed and Sealed this

Fourth Day of August, 1992

Attest:

DOUGLAS B. COMER

Attesting Officer    Acting Commissioner of Patents and Trademarks